United States Patent [19]

Peckham et al.

[11] Patent Number: 4,809,356
[45] Date of Patent: Feb. 28, 1989

[54] THREE-WAY POWER SPLITTER USING DIRECTIONAL COUPLERS

[75] Inventors: David S. Peckham; James J. Crnkovic, both of Palatine, Ill.

[73] Assignee: Motorola, Inc., Schaumburg, Ill.

[21] Appl. No.: 153,121

[22] Filed: Feb. 8, 1988

[51] Int. Cl.$^4$ ............................................. H04B 1/40
[52] U.S. Cl. ................................... 455/86; 333/116; 331/74; 455/78
[58] Field of Search .................. 455/78, 76; 331/74; 361/380, 397, 414; 333/109, 116, 128

[56] References Cited

U.S. PATENT DOCUMENTS

| 3,601,716 | 8/1971 | Bolt | 333/116 |
| 4,288,761 | 9/1981 | Hopfer | 333/116 |
| 4,566,132 | 1/1986 | Meyer et al. | 455/86 |

OTHER PUBLICATIONS

"Microwave Filters, Impedance Matching Networks, and Couple Structures", by Matthaei, Young and Jones, McGraw Hill, 1964 (Chapter 13), pp. 775-778.
"Power Divider/Combiners Small Size, Big Specs", by Richard C. Webb, Microwaves—Nov. 1981, pp. 67-73.
"Designing Microwave Filters, Couplers and Marching Networks", by Robert J. Wenzel, Besser Associates, Inc.

Primary Examiner—Robert L. Griffin
Assistant Examiner—Michael A. Ricci
Attorney, Agent, or Firm—Robert J. Crawford

[57] ABSTRACT

A three way oscillator signal power splitting circuit splits power provided at the output of a voltage controlled oscillator (VCO). The circuit is implemented on a printed circuit board section having a first layer which includes a first conductor for receiving the power from the VCO, a second layer having a second conductor, substantially parallel to and adjacent the first conductor, for receiving a portion of the power on the first main conductor via broadside coupling, and a third conductor, situated substantially parallel to and adjacent the first and second conductors, for receiving a portion of the power on the first main conductor also via broadside coupling. A ground conductor is additionally included on the third layer for providing a ground reference for the first, second and third conductors, and resistors are used to terminate the second and third conductors.

12 Claims, 1 Drawing Sheet 4,809,356

THREE-WAY POWER SPLITTER USING DIRECTIONAL COUPLERS

FIELD OF THE INVENTION

The present invention relates generally to radio frequency (RF) circuits, and, more particularly, to three way power splitting in RF receiver circuits.

BACKGROUND

Recent technological advances have enabled radio designers to significantly reduce the size of an RF radio. Such reduction is primarily attributed to very large scale circuit integration. Other radio circuits, which cannot be condensed into an integrated circuit, must be size-reduced using other techniques.

One such circuit is a transmission line power splitting circuit. This circuit is typically used at the output of the radio's voltage controlled oscillator (VCO) to split the power of the VCO's output signal to the receiver local oscillator input, the transmitter local oscillator path and the synthesizer feedback path (for controlling the frequency of the VCO). Such power splitting requires transmission line circuitry which cannot effectively be compacted into an integrated circuit because of size constraints. Hence, there have been significant efforts to design transmission line power splitting circuits which reduce the size of the circuit to accomodate the desired size reduction of the radio.

Of these efforts, one of the more successful combines a capacitive tap with a Wilkinson power splitter at the power signal to provide a 3-way power split. The Wilkinson power splitter typically includes two quarter wave-length transmission lines emanating from a connection at the power signal at one end and separated by an impedance isolation circuit at the other end to provide two output ports. The two output ports respectively provide two paths of split power, while the third path is provided by the capacitive tap.

This configuration is disadvantageous, however, because it fails to provide isolation between the output port at the capacitive tap and the output ports at the Wilkinson splitter. Additionally, the capacitive tap loads the input power signal causing a potential mismatch at the Wilkinson splitter output ports. Further, the quarter wave-length transmission lines of the Wilkinson splitter occupy excessive circuit board real estate. For these reasons, this configuration is often unacceptable.

There are two other common techniques for providing such a 3-way power split. One technique combines two 2-way Wilkinson power splitters, where one splitter is used to split the power provided at one of the output ports from the other splitter. The second technique involves a straight 3-way Wilkinson power splitter circuit, similar to the Wilkinson 2-way splitter but rather split 3 ways directly from the input power signal using three isolation circuits, each of which is connected between each pair of transmission lines. Both of these techniques, unfortunately, have significant disadvantages.

One disadvantage is that both require excessive circuitry to implement the isolation circuit(s). Each isolation circuit, common to each of these techniques, requires at least two discrete parts. The elimination of such discrete parts is a primary object in reducing the size of the radio.

A second disadvantage is that the layout of the quarter wave-length transmission lines and the discrete circuit elements requires excessive circuit board real estate. Although it is well known that the length of the quarter wave transmission lines can be reduced by adding additional capacitors, so doing adds to the number of discrete parts; therefore, defeating the goal of reducing the size of the circuit.

A third disadvantage is that these known techniques for power splitting do not allow flexibility in the power distribution at the output ports of the Wilkinson power splitting circuit.

Accordingly, a technique for splitting the power three ways at the output of a VCO (or similar circuit) is needed which overcomes the aforementioned deficiencies.

OBJECTS OF THE PRESENT INVENTION

It is a general object of the present invention to provide a circuit which overcomes the foregoing shortcomings.

It is a more particular object of the present invention to provide a 3 way power splitter for the output of a VCO which employs a minimal number of discrete components, which occupies a minimal amount of printed circuit board real estate and which provides flexibility in the power distribution.

It is another particular object of the present invention to provide a 3 way power splitter for the output of a VCO which has adequate isolation between the output ports.

BRIEF DESCRIPTION OF THE DRAWINGS

The features of the present invention which are believed to be novel are set forth with particularity in the appended claims. The invention, together with further objects and advantages thereof, may best be understood by making reference to the following description taken together with the accompanying drawings, in which reference numerals identify the elements, and wherein:

DETAILED DESCRIPTION OF THE PREFERRED EMBODIMENT

The arrangement disclosed in this specification has particular use for splitting oscillator signal (high frequency) power provided at one input port to three individual output ports. More particularly, the arrangement disclosed herein can be applied to splitting high frequency power provided at the output of a VCO in a radio transceiver and distributing such power to a receiver local oscillator input, to a transmitter local oscillator path and to a synthesizer feedback path (for controlling the frequency of the VCO).

Figure 1:
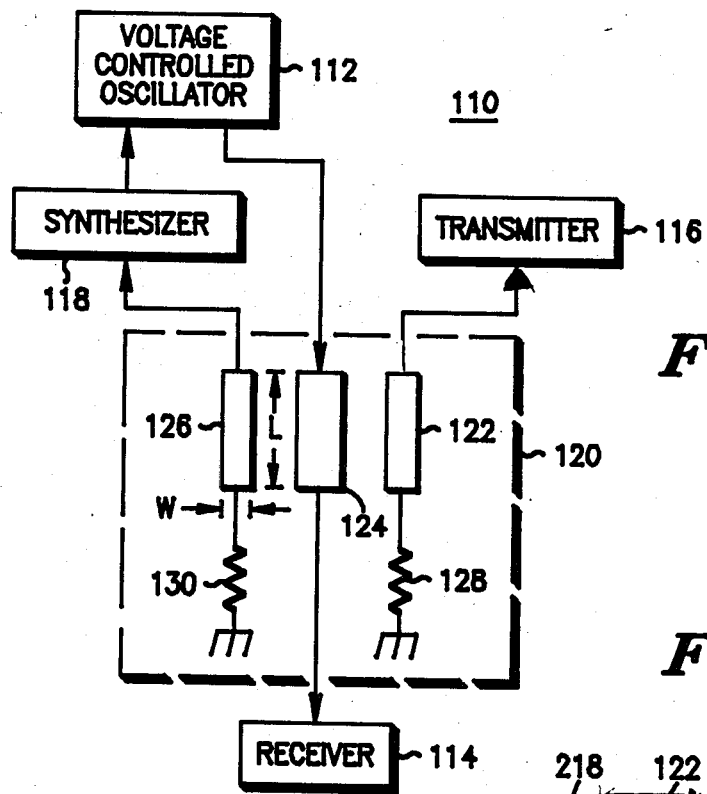
FIG. 1 is a diagram of a radio transceiver incorporating a 3-way power splitting circuit, according to the present invention.

FIG. 1 is illustrative. It includes a radio transceiver 110 wherein a VCO 112 is shown providing a high frequency power signal, via a power splitting circuit 120, to a receiver 114, a transmitter 116 and a synthesizer 118. The receiver 114, the transmitter 116 and the synthesizer 118 may be implemented using conventional circuits, such as those described in "DYNATAC Cellular Mobile Telephone Instruction Manual", Motorola Publication No. 68P81070E40, available from Motorola C & E Parts, 1313 E. Algonquin Rd, Schaumburg, Ill., 60196.

The power splitting circuit 120 includes three printed circuit board conductors 122, 124 and 126, and two terminating resistors 128 and 130 which each act as a terminating impedance for the conductors 122 and 126, respectively. Electrically, the conductor 124 is coupled to receive the power directly from the VCO. The conductors 122 and 126 are situated to each receive a portion of the power from the signal on the conductor 124 via at least partial broadside coupling. The resistors 128 and 130 are employed to provide selected termination to the directional coupling from the conductor 124. Structurally, the resistors 128 and 130 are mounted (or printed) on the printed circuit board and are electrically coupled (preferably electrically connected) to the conductors 122 and 126 within the printed circuit board via conventional methods. The three conductors 122, 124 and 126, whose length and width are depicted as L and W, respectively, are particularly arranged as part of a printed circuit board section.

Figure 2A:
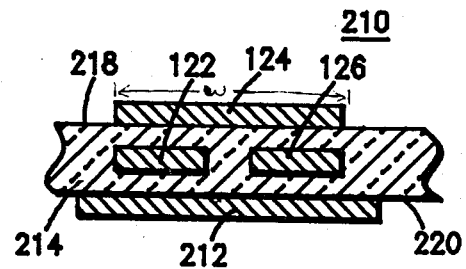
FIG. 2a is a diagram illustrating a cross-sectional view of a printed circuit board section including a 3-way power splitting circuit, according to the present invention.

FIG. 2a illustrates a preferred manner in which the conductors 122, 124 and 126 of FIG. 1 may be arranged as part of a three layer printed circuit board section 210. FIG. 2a depicts a cross-sectional view of the printed circuit board section 210 depicting the width of each conductor shown therein. The section 210 includes a ground conductor 212, providing a ground reference for the conductors 122, 124 and 126, and a conventional dielectric material 214 included in the interior of the section 210. The conductor 124 is shown on a first outside surface 218 of the section 210, while the ground conductor 212 is shown on a second outside surface 220 of the section 210. The two remaining conductors 122 and 126 are shown to be part of an inside layer of the section 210.

The conductors 122 and 126 are preferably situated directly below and parallel to (lengthwise) the conductor 124. This allows for optimal coupling from the conductor 124 to each of the conductors 122 and 126. To increase the coupling between the conductors 122 and 126 and the conductor 124, the widths and/or the lengths of the conductors 122 and 126 may be increased, and/or the conductors 122 and 126 may be more directly situated below the conductor 124.

For example, the conductors 122, 124 and 126 of the printed circuit section 210 of FIG. 2a have been implemented (using copper) and tested for 12 dB coupling from the conductor 124 to the conductors 122 and 126, with 50 Ohms of termination (using standard 51 Ohm resistors 128 and 130 of FIG. 1) and with the following dimensions:

width of conductor 124: 40 thousands of an inch (mils);
width of conductors 122 and 126: 10 mils;
length of conductors 122, 124 and 126: 875 mils;
thickness of each conductor: about 1 mil;
distance between the conductors 122 and 126: 20 mils;
distance between the layer including conductors 122 and 126 and the layer including conductor 124: about 11 mils; and
distance between the layer including conductors 122 and 126 and the layer including ground conductor 212: about 11 mils.

In radio applications, the criticality of the isolation between the receiver and the transmitter is well known. Test results for the arrangement of FIG. 2a were more than adequate for the intended application. Isolation between the conductors 122 and 126 was measured at 26 dB, while reverse isolation along the conductor 124 to each of the conductors 122 and 125 was measured at 23 dB. Additionally, only 1.8 dB of loss was measured from the output of the VCO 112 (of FIG. 1) to the input of the receiver 114.

Figure 2B:
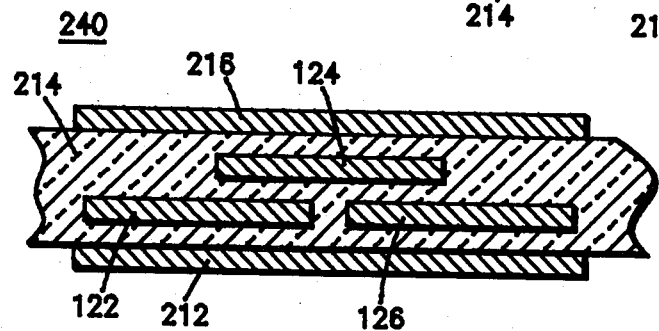
FIG. 2b is a diagram illustrating a cross-sectional view of a printed circuit board section including an alternate 3-way power splitting circuit, according to the present invention.

FIG. 2b, also depicted as a cross-sectional view, illustrates an alternate arrangement of the conductors 122, 124, 126 and 212 as part of a printed circuit board section 240. Section 240 is similar to section 210 of FIG. 2a except that section 240 includes a fourth conductor layer adjacent to the layer in which conductor 124 is shown. The fourth layer is an outside layer which includes a ground conductor 216. The configuration of FIG. 2b is advantageous in that the arrangement described therein is totally isolated to/from neighboring circuitry.

For applications in which such a fourth layer is used, this arrangement is useful because it adds additional ground insulation to/from nearby circuitry.

Figure 2C:
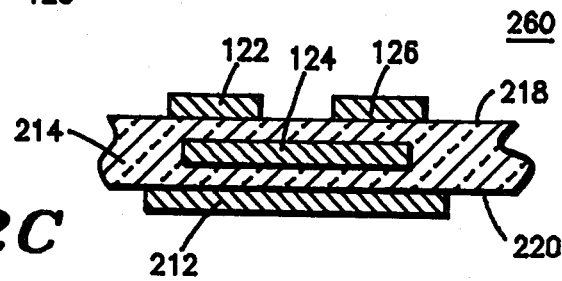
FIG. 2c is a diagram illustrating a cross-sectional view of a printed circuit board section including a second alternate 3-way power splitting circuit, according to the present invention.

FIG. 2c, also depicted as a cross-sectional view, illustrates a second alternate arrangement of the conductors 122, 124 and 126 of FIG. 2a as part of a printed circuit board section 260. This arrangement is similar to the arrangement shown in FIG. 2a except that the layer including conductor 124 and the layer including conductors 122 and 126 have been transposed. This arrangement (section 260) requires that the conductors 122 and 126 be wider than the conductor 124 to obtain the same coupling coefficients and impedances of section 210.

The dimensions of the various conductors are important in order to meet coupling requirements of the particular application. Because the arrangements described and illustrated herein are novel, no algorithms or "cookbook" procedures have yet been developed which may be used to design optimal dimensions for a given application. However, the examples and tips provided above clearly set forth the manner in which dimension designing may be accomplished.

It will be understood by those skilled in the art that various modifications and changes may be made to the present invention without departing from the spirit and scope thereof.

What is claimed is:

1. A circuit for splitting high frequency power provided at a power terminal, comprising:
a circuit board section having:
at least a first layer, a second layer and a third layer, situated respectively;
a first main conductor, on one of said first or second layers, for receiving the power at the power terminal;
a second conductor, on the other of said first or second layers and substantially parallel to and adjacent the first main conductor, for receiving a portion of the power on the first main conductor via at least partial broadside coupling;

a third conductor, situated on the same layer as the second conductor and substantially parallel thereto and substantially adjacent the first main conductor, for receiving a portion of the power on the first main conductor via at least partial broadside coupling; and a ground conductor, situated on the third layer, for providing a ground reference for the first main conductor, and the second and third conductors;

whereby the first main conductor, the second conductor and the third conductor each provide a portion of the power from the power terminal to external circuitry.

2. A circuit, according to claim 1, further including a second ground layer on a fourth layer, situated adjacent the first layer, for providing additional ground reference for the first main conductor, and the second and third conductors.

3. A circuit, according to claim 1, further including first and second terminating impedances respectively coupled to the second and third conductors.

4. A circuit, according to claim 1, wherein the first main conductor is situated such that it substantially overlaps the second and third conductors.

5. A three way oscillator signal power splitting circuit for splitting power provided at the output of a voltage controlled oscillator circuit (VCO), comprising:

a circuit board section having:
   a first layer having a first conductor for receiving the power from the VCO;
   a second layer having a second conductor, substantially parallel to and adjacent the first conductor, for receiving a portion of the power on the first main conductor via at least partial broadside coupling, and a third conductor, situated substantially parallel to and adjacent the first and second conductors, for receiving a portion of the power on the first main conductor via at least partial broadside coupling; and
   a ground conductor, situated on the third layer, for providing a ground reference for the first, second and third conductors;

first termination impedance, situated on said circuit board section and coupled to said second conductor; and second termination impedance situated on said circuit board section and coupled to said third conductor;

whereby each of the first, second conductor and third conductors provide a portion of the power from the power terminal, via respective output ports, to external circuitry.

6. A circuit, according to claim 5, wherein the first layer and the third layer are part of outside surfaces of the circuit board sections.

7. A circuit, according to claim 5, wherein the first main conductor is situated such that it at least substantially overlaps the second and third conductors.

8. A circuit, according to claim 5, wherein the ratio of the width of the first conductor to the width of the second conductor or third conductor is about 3 to 1.

9. A circuit, according to claim 8, wherein the coupling from first conductor to the second and third conductors is about 10 dB.

10. A circuit, according to claim 8, wherein the length of the first, second and third conductors is about 900 mils, the distance between the second and third conductors is about 11 mils, and the distances between the layers is about 11 mils.

11. A circuit, according to claim 5, wherein the first and second termination impedances are selected to optimize the isolation between the output ports.

12. A radio transceiver, comprising:

a voltage controlled oscillator (VCO) for providing a signal having power to be distributed therefrom;

a receiver;

a transmitter;

a synthesizer; and a circuit board section including:
   a first layer having a first conductor for receiving the power from the VCO and for providing power to the receiver;
   a second layer, contiguously situated adjacent the first layer, having a second conductor which is substantially parallel to and adjacent the first conductor for receiving a portion of the power on the first conductor via at least partial broadside coupling and for providing power to the synthesizer, and a third conductor, situated substantially parallel to and adjacent the first and second conductors, for receiving a portion of the power on the first conductor via at least partial broadside coupling and for providing power to the transmitter; and
   a third layer, situated closer to the second layer than to the first layer, having a ground conductor for providing a ground reference for the first, second and third conductors; and first and second terminating impedances respectively coupled to the second and third conductors.

* * * * *